United States Patent [19]

Windmiller

[11] Patent Number: 5,045,854

[45] Date of Patent: Sep. 3, 1991

[54] INTEGRATED HIGH SPEED SYNCHRONOUS COUNTER WITH ASYNCHRONOUS READ-OUT

[75] Inventor: Keith A. Windmiller, Loveland, Colo.

[73] Assignee: Hewlett-Packard Company, Palo Alto, Calif.

[21] Appl. No.: 487,490

[22] Filed: Mar. 1, 1990

[51] Int. Cl.[5] ............................................. H03M 7/16
[52] U.S. Cl. ......................................... 341/97; 341/96; 377/34
[58] Field of Search ....................... 341/97, 10, 96, 98, 341/106; 377/30, 34, 45, 56, 125, 44, 37

[56] References Cited

U.S. PATENT DOCUMENTS

| 3,982,108 | 9/1976 | Horsley | 377/30 |
| 4,408,336 | 10/1983 | Das Gupta | 377/34 |
| 4,519,091 | 5/1985 | Chu et al. | 377/30 |

OTHER PUBLICATIONS

"Phase Digitizing: A New Method for Capturing and Analyzing Spread-Spectrum Signals", *Hewlett-Packard Journal*, Feb. 1989, p. 28.

*Primary Examiner*—A. D. Pellinen
*Assistant Examiner*—Brian K. Young

[57] ABSTRACT

A high speed, synchronous counter which counts using a Gray code, Because Gray code counting has the unique property that only a single bit of the counter changes with each new count, the output of the counter may be latched at any time and the latched value will never be more than one count away from the actual count value in the counter. The present invention provides a look-ahead qualification bit that provides for an eight count look-ahead. With this eight count look-ahead capability, the qualification inputs to the high order bits can be created through a series of AND gates, each having only two inputs, thus saving significatnt power and space. Because most digital circuits require the output of a counter to be in binary code, the invention provides a conversion means for converting the Gray code input to a binary output.

14 Claims, 5 Drawing Sheets

INTEGRATED HIGH SPEED SYNCHRONOUS COUNTER WITH ASYNCHRONOUS READ-OUT

FIELD OF THE INVENTION

This invention relates to digital electronic circuits and more particularly to digital counting circuits. Even more particularly, the invention relates to a high speed synchronous digital counter with asynchronous read-out capability.

BACKGROUND OF THE INVENTION

When measuring the time between two events, traditional circuits have used the occurrence of the first event to start a counter which counts clock pulses, and the occurrence of the second event to stop the counter. The value of the counter is then read to determine the time between the events. After reading the value of the counter, the circuit is reset for the next series of events. The time during which the circuit is being reset is called dead time, and during this dead time, occurrences of the events will go unnoticed. The performance of the circuit can be improved considerably if this dead time can be eliminated, thus creating a zero dead time counter. A zero dead time counter must be capable of continuously counting, and be capable of allowing an asynchronous read-out of the counter which does not interfere with counting. When reading the output of the counter asynchronously, a metastability problem occurs if a read-out is attempted at the time the counter is changing value. If the output is latched while one or more bits is changing value, the changing bits could be latched as either a one or zero, thus the output is metastable. This problem is very severe in binary counters, because many stages of the counter of may be changing value simultaneously, for example when a carry is being rippled through the counter. In a binary counter, if the higher order bits are changing at the time of the read-out, a large discrepancy may occur in the count value.

Traditionally, this metastability problem has been solved in one of two ways, as described by David C. Chu in his article "Phase Digitizing: A New Method for Capturing and Analyzing Spread Spectrum Signals", *Hewlett Packard Journal*, February 1989, page 28 at page 33. Two types of counters can be used for this type of circuit. A traditional binary ripple counter consists of series of cascaded divide-by-two stages. With the frequency halved after each stage, the maximum count rate is effectively determined by the first few stages. Subsequent stages do no affect the maximum count rate, so they can be slow and numerous. The problem with this type of counter is the time required for a carry to ripple through all stages of the counter. If the output of the counter is read while a carry bit is rippling through the counter, the output is metastable and will be indeterminate for all stages that are changing value. The traditional solution to this problem is to allow sufficient time for a carry to propagate through all stages before attempting a read-out, which severely limits the maximum count rate for the counter.

A synchronous counter may also be used to solve the metastability problem. With synchronous counting, a logic network adds one to the current count state so that the next event clocks the counter to the next state immediately. With careful design, the synchronous counter can be read on the fly, since all bits theoretically change at once. With long count chains, however, the logic network becomes complex and unwieldy, and processing time lengthens. Since every bit must be as fast as the fastest bit, power consumption may be severe in this type of circuit.

The approach taken by David Chu in the article referenced above, is to combine a synchronous counter and a ripple counter, and add the complexity to the latching circuit. Chu uses a synchronous counter for the first few stages, typically eight bits, and then uses a ripple counter for the remaining stages. In addition, Chu provides a delay circuit to delay any read-out for a short time after a count pulse is sent to the ripple stages. This delay is sufficiently long to allow a carry to propagate through all ripple stages. When a read-out signal occurs, the bits of the synchronous portion of the counter are read out and latched immediately, while the bits from the ripple portion of the counter are read out after the delay, and thus after the carry has propagated.

While this approach works well for bipolar circuits, it is not suitable for slower, lower power, processes such as CMOS. There is need in the art then for a synchronous counter whose outputs may be asynchronously latched. There is further need in the art for such a counter that can be implemented in a CMOS process. Still another need in the art is for such a counter that can be implemented using low power circuits. Yet another need is for such a circuit with a simplified latching method.

SUMMARY OF THE INVENTION

It is an aspect of the present invention to provide a high speed synchronous counter having asynchronous read-out capability.

It is another aspect of the invention to provide such a counter that resolves metastability problems associated with asynchronously latching the output of the counter.

Another aspect of the invention is to resolve such metastability problems by using a gray code counter wherein only one bit changes with each count, therefore the latched output will be within one count of the counter value.

Another aspect of the invention is to provide a look-ahead qualify signal to stretch the next-state counter setup for upper bits of the counter from every cycle to every eighth cycle of the counter thus increasing the frequency range of the counter.

Still another aspect of the invention is to qualify the input to each register of the upper bits using a serial AND circuit.

A further aspect of the invention is to provide an improved conversion apparatus and method for converting the output of the counter from gray code to binary code.

A further aspect of the invention is to divide the latched output of the counter into sections of bits and to convert each section of the counter from gray code to binary code while ignoring other sections, then adjusting the converted code for each section based on the value of the low order bits of all higher sections.

A still further aspect of the invention is to provide such adjustment while allowing a serial conversion of the low order bits of all higher four bit sections.

The above and other aspects of the invention are accomplished in a high speed, synchronous counter which counts using a Gray code. Because Gray code counting has the unique property that only a single bit of the counter changes with each new count, the output of the counter may be latched at any time and the latched value will never be more than one count away from the actual count value in the counter. Unlike binary counters where a plurality bits, sometimes every bit in the counter, may change when counting changes the counter state from one state to another, a Gray code counter never changes more than one bit when counting from one state to another. Also, this one bit change results in only a change of one in the count value, so that if the counter is latched while this one bit is in the process of changing, the value latched will never be more than one count away from the value contained in the counter.

Using a synchronous counter, however, introduces an additional problem into the count circuitry. That problem is that each bit in the counter must AND the value of all bits lower in value in order to determine when the bit should set or clear. Therefore, in a large counter, the high order bits require AND gates having a large number of inputs. For example, the sixteenth bit of sixteen bit counter requires a sixteen input AND gate, and the twenty-eighth bit of a twenty-eight bit counter requires a twenty-eight input AND gate, etc. This problem is resolved in the present invention by providing a look-ahead qualification bit that provides for an eight count look-ahead. With this eight count look-ahead capability, the qualification inputs to the high order bits can be created through a series of AND gates, each having only two inputs.

Because most digital circuits require the output of a counter to be in binary code, the invention provides a conversion means for converting the Gray code output to a binary output. The invention divides the counter output into sections of four bits, and each section of four bits is initially converted from Gray code to binary code independently of the other bits in the counter. After this initial conversion, the output of each of the four bit sections is inverted if the exclusive OR of the low order bits of all higher order sections is one. Also, since each section of bits needs the exclusive OR of the low order bit of all higher order sections, each section of bits provides an output which is the exclusive OR of the low order bit of that section and the result of the exclusive OR of all higher bit sections. Therefore, the exclusive OR circuit for each section needs only two inputs.

BRIEF DESCRIPTION OF THE DRAWINGS

The above and other aspects, features, and advantages of the invention will be better understood by reading the following more particular description of the invention, presented in conjunction with the following drawings, wherein.

DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1:
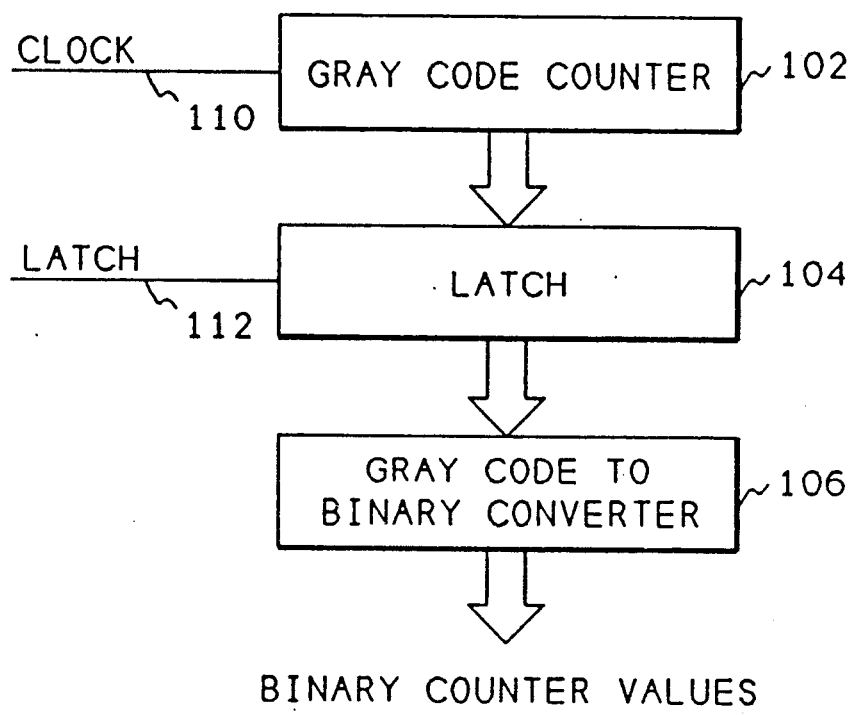
FIG. 1 shows a block diagram of the invention.

FIG. 1 shows a block diagram of the invention. Referring now to FIG. 1, a Gray code counter 102 is driven by a clock 110. The output of the Gray code counter 102 is transferred to a latch 104 when a latch signal 112 is activated. The output of the latch 104 is converted from Gray code to binary by the Gray-code-to-binary converter 106. The Gray code counter 102 is typically twenty-eight bits in the present invention, however, the invention is not limited to any particular length of counter and could be used for counters significantly larger or smaller than twenty-eight bits.

Gray code has a significant advantage in high speed counters, because it has the property that only one bit changes in the entire counter when counting from one state to the next. This aspect is particularly important when the output of the counter must be latched. Because of the feature of only one bit in the counter changing from one state to the next, if the output of the counter is latched while a state change is occurring, the output will never be more than one count different from the value of the counter. For example, in a four bit counter, if a binary counting method were used, it would be possible to generate an output of fifteen when the counter was changing from state 7 to state 8. If the high order bit changes from a zero to a one faster than the three low order bits change from one to zero, the output of the counter could be read as all ones, a state of fifteen. This condition is not possible with a Gray code counter.

A simple rule for generating Gray code states is to begin with the state of all zeros. To change to the next state, always change the single least significant bit that will result in a previously unused state. Table 1 shows the states of the last six bits of the counter of the present invention, for the first thirty-three counts. The operation of a Gray code counter can be readily seen by observing bits Q24, Q25, Q26, and Q27 for the rows having decimal values zero through fifteen. In row 0, all four bits, Q24–Q27, are zero. When the count increments to one, Q27 changes to a one, resulting in a state of 0001. As the count increments to two, Q26 changes to a one, resulting in a state of 0011. As the count increments to three, Q27 changes back to a zero, resulting in a state of 0010. This continues through a count of fifteen which is a state of 1000. Note that for each change of state with each new count, only one of the four bits changes.

An easier way to generate the states electronically, is to create an AUX least significant bit. The LSB AUX is created by dividing the clock input of the counter by two. Using the LSB AUX, the states of the counter can be created using the following rule:

A bit of the counter will toggle with the next clock signal if:

A. the next least significant bit is one,

B. and all other least significant bits are zero,

C. and the LSB AUX is one.

The only exception to this rule is the least significant bit of the counter, Q27 in this example, which toggles whenever the LSB AUX bit is a zero. This counting method can be readily seen by following several rows of Table 1 and the values of the LSB AUX bit.

Figure 2:
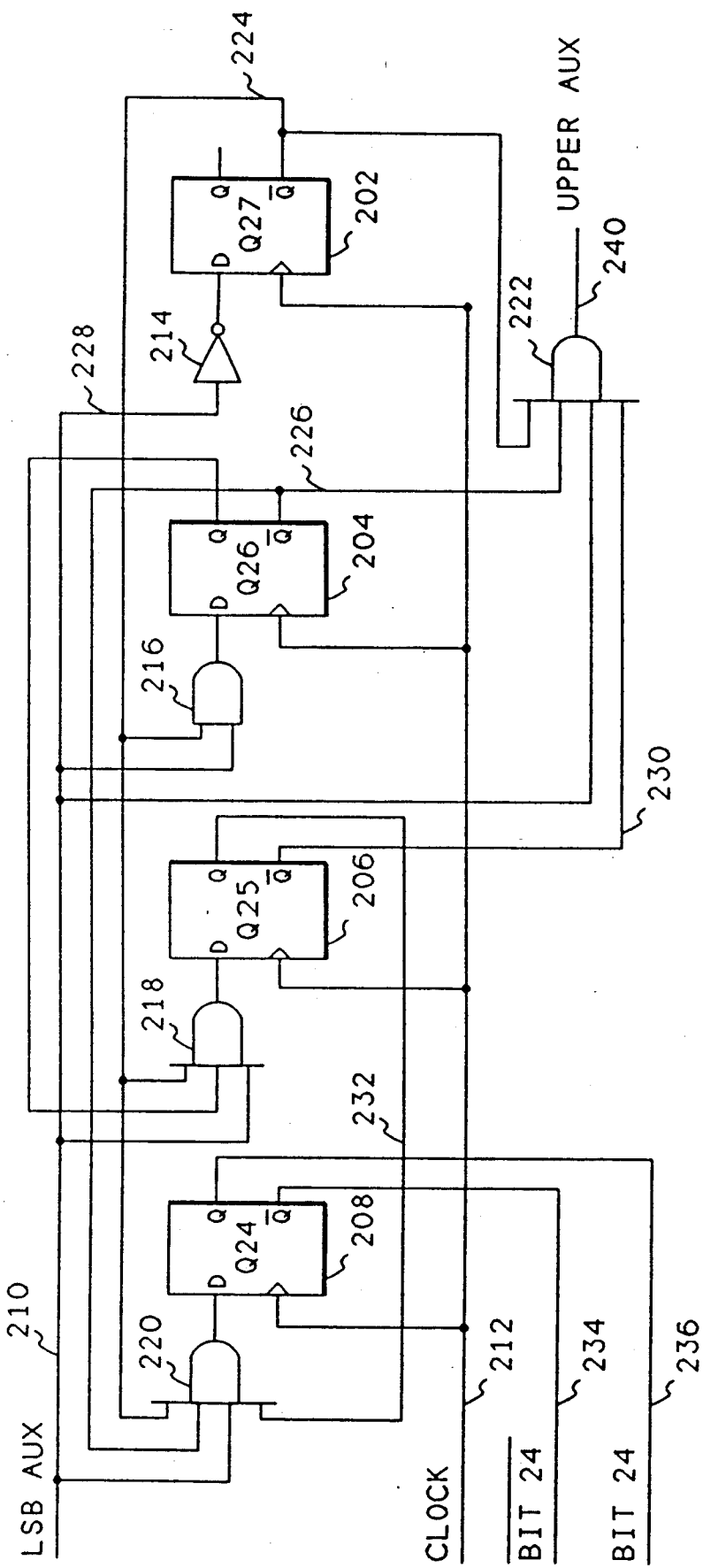
FIG. 2 is a logic diagram showing the low order four bits of the counter and illustrating the upper aux signal.

FIG. 2 shows a schematic diagram of bits Q24 through Q27 of the counter of the present invention. Table 2 shows the logic equations for generating the inputs to the flip-flops of FIG. 2, where "*" represents a logical AND, and "~" represents inversion. Referring now to FIG. 2 and Table 2, D flip-flops 202, 204, 206, and 208 store the low order four bits of the counter 102 (FIG. 1) of the present invention. The LSB AUX bit 210 is inverted by invertor 214 and input to the low order bit 27, flip-flop 202. The logic equation for this input is shown in Table 2, row 1. The inverted flip-flop output 224 of bit 27 is connected to AND gate 216 whose other input is the LSB AUX bit 210. The output of AND gate 216 provides the input to D flip-flop 204, bit 26 of the counter. The logic equation for this input is shown in row 2 of Table 2, which shows the input to be the AND of the LSB AUX bit and the compliment of bit 27. As illustrated by row 3 of Table 2, the input to bit 25, D flip-flop 206, is the logical AND of the LSB AUX bit, the inverted output of bit 27, and the non-inverted output of bit 26. The input to D flip-flop 208, bit 24, is logical AND of the LSB AUX bit, the inverted output of bit 27, the inverted output of bit 26, and the non-inverted output of bit 25.

As shown by the above description of FIG. 2, if the construction of the other bits of the twenty-eight bit counter of the invention are done in a similar manner, the AND gate input to each higher order bit requires one additional input signal. The logical result is that bit 0, the most significant bit, of the counter will require a twenty-eight input AND function. Such a function, when implemented in an integrated circuit, would require a considerable amount of integrated circuit real estate, and consume an enormous amount of power. In order to reduce the amount of power being consumed, and the amount of real estate on the integrated circuit, the present invention creates an UPPER AUX bit which is used to qualify all bits more significant than the low order four bits of the counter. This UPPER AUX bit will allow the "next state" counter setup to be stretched from every cycle to every eighth cycle. Because of this additional time for setting up the higher order bits, a different circuit can be utilized which saves considerable power and integrated circuit real estate. The UPPER AUX bit is defined as:

LSB AUX * ~Q27 * ~Q26 * ~Q25

AND gate 222 in FIG. 2 creates the UPPER AUX signal 240 of the present invention.

Table 3 illustrates the logic equations for the inputs to the flip-flops, using the UPPER AUX bit to generate inputs for higher order bits Q23, Q22 etc.

Figure 3:
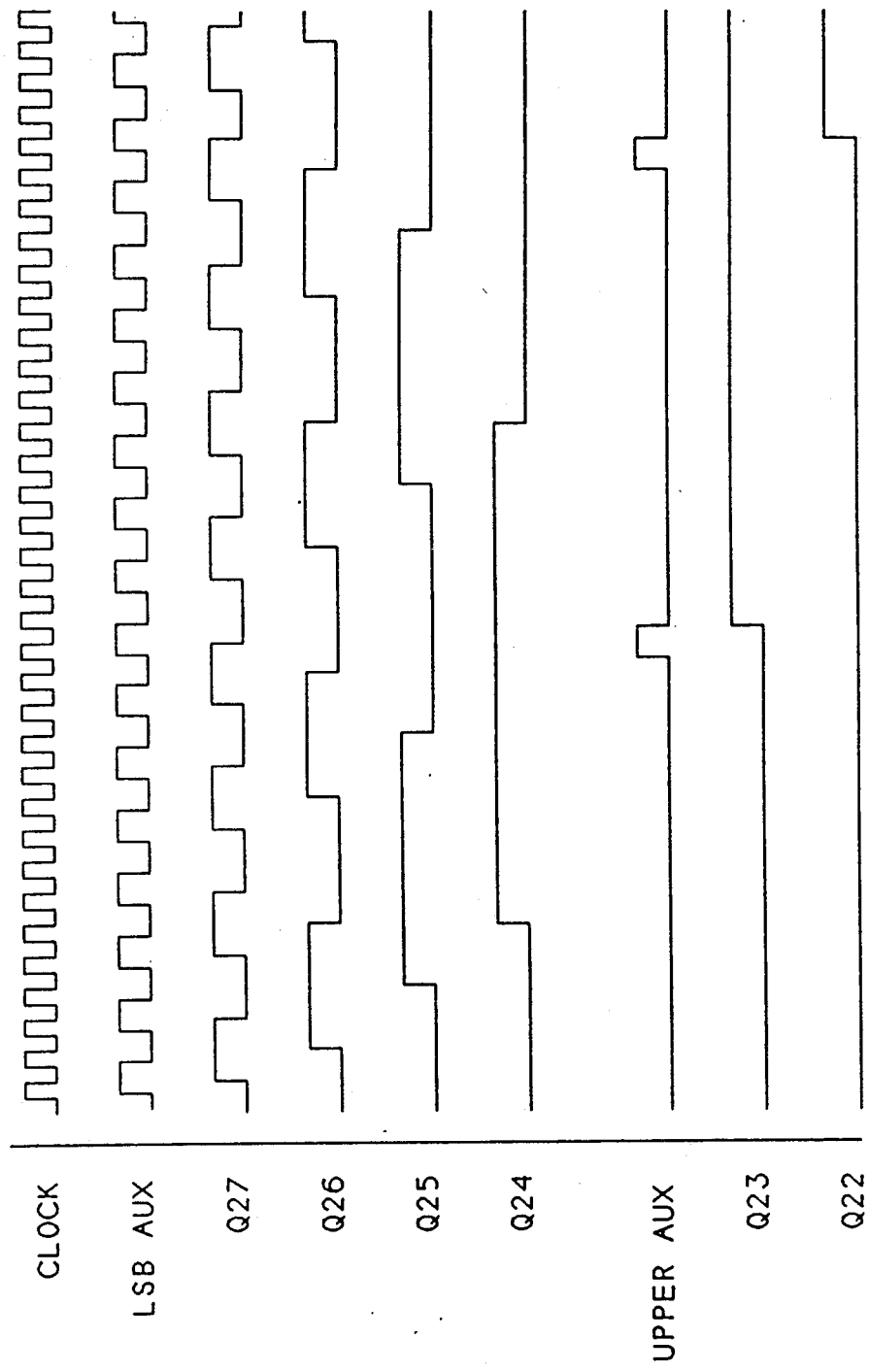
FIG. 3 shows a timing diagram of the operation of the invention.

FIG. 3 shows a timing diagram of the circuit including the clock input, the LSB AUX signal, the UPPER AUX signal, and outputs of the low order six flip-flops of the counter. Referring now to FIG. 3, the timing diagram illustrates that flip-flop Q24 changes to a high state eight clock cycles prior to the UPPER AUX bit changing to a high state. The diagram also shows that the higher order bits toggle only after the UPPER AUX bit is high. Because of the eight clock cycles between Q24 changing to a high state and the UPPER AUX bit changing to a high state, the inputs to the higher order bits have eight clock cycles to settle. This settling time is long enough that serial AND functions can be used instead of the parallel AND functions needed for the low order four bits. These serial AND functions, as will be illustrated below, provide significant advantages in power consumption and integrated circuit real estate.

Figure 4:
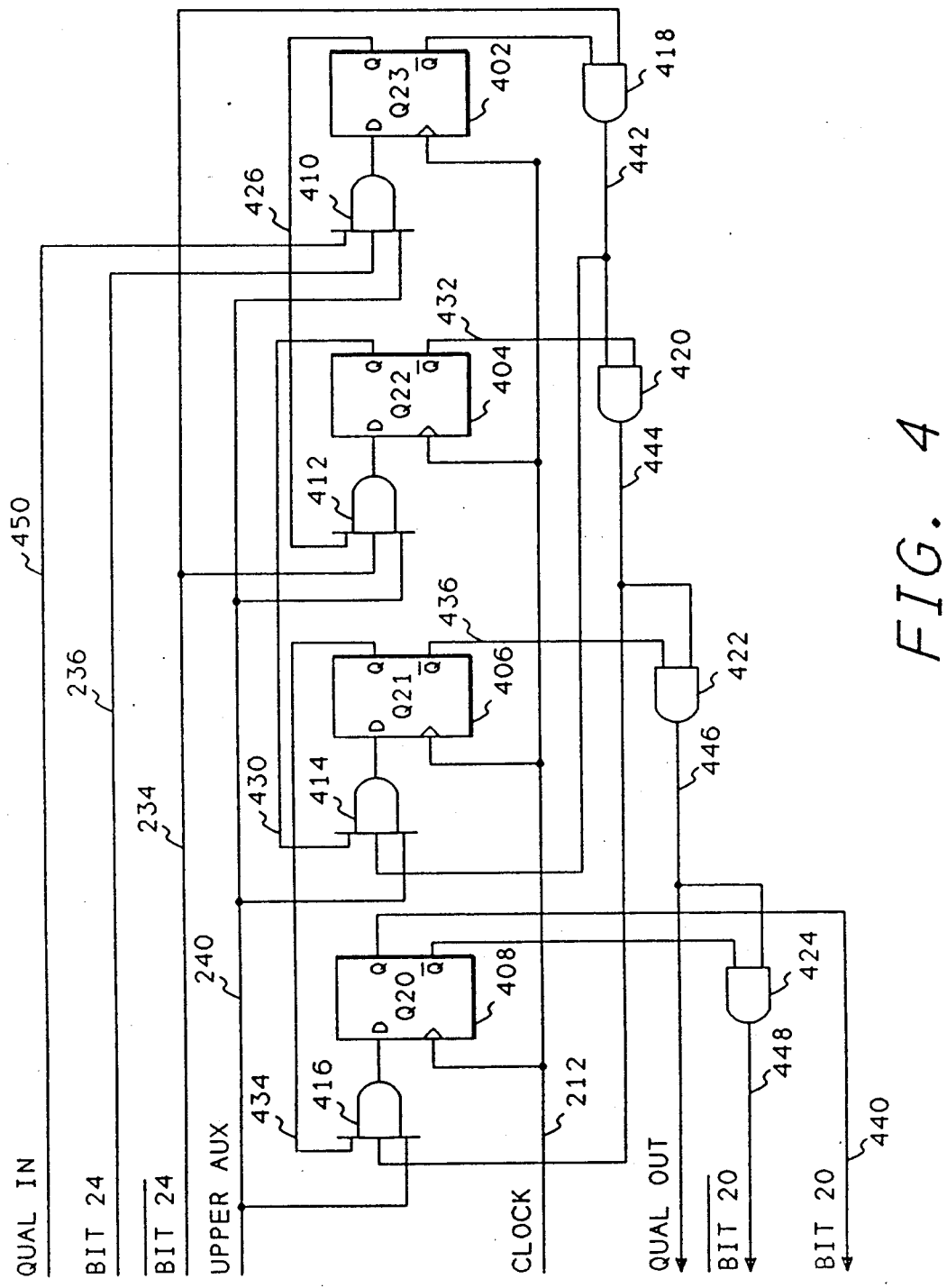
FIG. 4 is a logic diagram showing the next higher four bits of the counter and illustrating the use of the serial AND circuit.

FIG. 4 is a schematic diagram of the next higher four bits, bits 23 through bits 20, of the counter of the present invention. Referring now to FIG. 4, D flip-flops 402, 404, 406, and 408 represent bits 23, 22, 21, and 20, respectively, of the counter. AND gate 410 qualifies the input to bit 23, flip-flop 402. Also as shown in Table 3, the input to bit 23 is a logical AND of the UPPER AUX bit and the non-inverted output of Q24. The QUAL IN 450 signal for this bit is a logical one, typically tied to VDD. Because of the use of the UPPER AUX bit, and the use of the serial AND functions, described below, all other qualifying AND gates to all other flip-flops of the counter, have three signal inputs. This is illustrated by AND gate 412 which is the input to bit 22. The inputs to AND gate 412 comprise the UPPER AUX bit 240, the non-inverted output 426 of bit 23, and the inverted output 234 of bit 24. The qualifying input to bit 21 is created by AND gate 414, whose inputs are the UPPER AUX bit 240, the non-inverted output 430 of bit 22, and the logical AND of the inverted output 428 of bit 23, and the inverted output 234 of bit 24. AND gate 418 is the first of the serial AND gates used to create qualifying inputs to the upper flip-flops. As shown in Table 3, for flip-flops Q21 and higher, the qualifying input will always be comprised of the UPPER AUX bit, the non-inverted output of the next lower flip-flop, and the logical AND of the inverted outputs of all the other lower flip-flops down to Q24. This logical AND of the inverted outputs of the lower flip-flops is created by the serial AND gates 418, 420, 422, and 424. Each of the serial AND gates 418, 420, etc. creates the logical AND of the inverted output of a flip-flop, ANDed with the inverted output of all previous flip-flops. These serial AND gates save significant power, and significant integrated circuit real estate, while still allowing the counter to function as a synchronous counter. For bits 19 and higher, the circuit of FIG. 4 is replicated, with the QUAL OUT 446 signal of the next lower four bits being connected to the QUAL IN 450 signal, the BIT 20 signal 440 of the next lower four bits connected to the BIT 24 236 signal, and the ~BIT 20 448 signal of the next lower four bits being connected to the ~BIT 24 234 signal.

Figure 5:
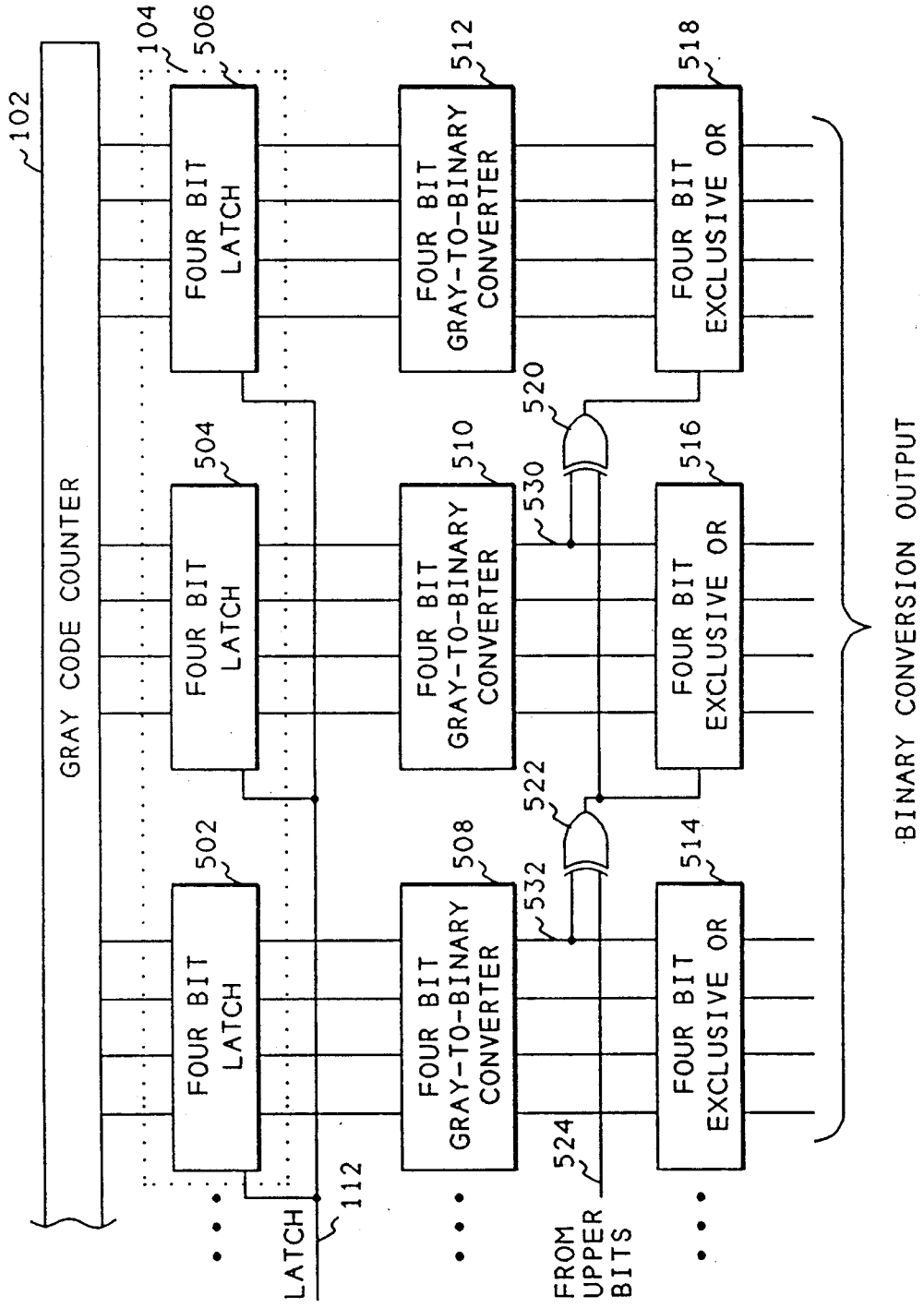
FIG. 5 is a block diagram showing the gray code to binary code conversion apparatus and method.

As described above, the Gray code counter 102 (FIG. 1) of the present invention provides a method of counting wherein only a single bit changes for each new count. Most other circuits, however, require a counter output to be in binary form. Therefore, for the Gray code counter to be useful in most circuits, its output must be converted from Gray code to binary code. FIG. 5 shows a block diagram of the latch output of the Gray code counter, and the Gray-code-to-binary conversion circuits. Referring now to FIG. 5, twelve bits of the output of Gray code counter 102 (FIG. 1) are shown. These twelve bits are connected to three four-bit latches 502, 504, and 506. The four-bit latches 502, 504, and 506 are a part of the latch circuit 104 (FIG. 1). The four-bit latches 502, 504, and 506 latch the output of the Gray code counter 102 when they receive the latch signal 112. Because of the high speed nature of the Gray code counter of the present invention, it is also very important that the Gray-code-to-binary conversion be accomplished in high speed. Gray-code-to-binary conversion is normally accomplished by exclusive ORing the output of each bit of the Gray code with the converted next higher order bit. The most significant bit, however, is the same for Gray code and binary code, therefore the most significant bit output of the Gray code counter can be copied directly to the converted binary output. Significant time is lost by the ripple effect of this type of conversion. This conversion is illustrated by the logic equations of Table 4, where "@" represents the exclusive OR function.

The present invention significantly improves performance of the Gray-code-to-binary code conversion by dividing the counter into sections of four bits. Each section of four bits is initially converted from Gray code to binary code, in the above described manner, as if it were an isolated four-bit counter. That is, during the initial conversion of each four bits, the values of all higher order bits are ignored. After the initial conversion, a final conversion stage is accomplished by examining the low order bits of each of the higher order four-bit sections. These low order bit are all exclusive ORed, and if the result is a one, all four bits of the four-bit section are inverted.

FIG. 5 schematically illustrates this conversion process. Each of the four bit Gray to binary converters 508, 510, and 512 convert four bits of the Gray code counter output into four bits of binary output, while ignoring all higher order bits. The four bit exclusive OR circuit 518, exclusive ORs each of the four bits output by Gray to binary converter 512 with the output of the exclusive OR circuit 520. The exclusive OR circuit 520 examines the low order bit 530 of the output of Gray to binary converter 510 with the exclusive ORed results of all the low order bits of all higher section converters. If the output of exclusive OR gate 520 is a logical 1, the four bits output by the Gray to binary converter 512 are all inverted by the four-bit exclusive OR circuit 518. Similarly, the exclusive OR circuit 516 will invert the four bits of the Gray to binary converter 510 output, if the output of exclusive OR gate 522 is a logical 1. In this manner, the serial exclusive OR gates 520, 522, etc., combined with the two stage conversion process, convert the Gray code output of the counter to a binary value at high speed.

Having thus described a presently preferred embodiment of the present invention, it will now be appreciated that the aspects of the invention have been fully achieved, and it will be understood by those skilled in the art that many changes in construction and circuitry and widely differing embodiments and applications of the invention will suggest themselves without departing from the spirit and scope of the present invention. The disclosures and the description herein are intended to be illustrative and are not in any sense limiting of the invention, more preferably defined in scope by the following claims.

TABLE 1

Gray Code Counter
Least Significant Seven Bits

| MSB Q22 | Q23 | Q24 | Q25 | Q26 | LSB Q27 | HEX | DEC | LSB AUX |
|---|---|---|---|---|---|---|---|---|
| 0 | 0 | 0 | 0 | 0 | 0 | 00 | 0 | 0 |
| 0 | 0 | 0 | 0 | 0 | 1 | 01 | 1 | 1 |
| 0 | 0 | 0 | 0 | 1 | 1 | 02 | 2 | 0 |
| 0 | 0 | 0 | 0 | 1 | 0 | 03 | 3 | 1 |
| 0 | 0 | 0 | 1 | 1 | 0 | 04 | 4 | 0 |
| 0 | 0 | 0 | 1 | 1 | 1 | 05 | 5 | 1 |
| 0 | 0 | 0 | 1 | 0 | 1 | 06 | 6 | 0 |
| 0 | 0 | 0 | 1 | 0 | 0 | 07 | 7 | 1 |
| 0 | 0 | 1 | 1 | 0 | 0 | 08 | 8 | 0 |
| 0 | 0 | 1 | 1 | 0 | 1 | 09 | 9 | 1 |
| 0 | 0 | 1 | 1 | 1 | 1 | 0a | 10 | 0 |
| 0 | 0 | 1 | 1 | 1 | 0 | 0b | 11 | 1 |
| 0 | 0 | 1 | 0 | 1 | 0 | 0c | 12 | 0 |
| 0 | 0 | 1 | 0 | 1 | 1 | 0d | 13 | 1 |
| 0 | 0 | 1 | 0 | 0 | 1 | 0e | 14 | 0 |

TABLE 1-continued

Gray Code Counter
Least Significant Seven Bits

| MSB Q22 | Q23 | Q24 | Q25 | Q26 | LSB Q27 | HEX | DEC | LSB AUX |
|---|---|---|---|---|---|---|---|---|
| 0 | 0 | 1 | 0 | 0 | 0 | 0f | 15 | 1 |
| 0 | 1 | 1 | 0 | 0 | 0 | 10 | 16 | 0 |
| 0 | 1 | 1 | 0 | 0 | 1 | 11 | 17 | 1 |
| 0 | 1 | 1 | 0 | 1 | 1 | 12 | 18 | 0 |
| 0 | 1 | 1 | 0 | 1 | 0 | 13 | 19 | 1 |
| 0 | 1 | 1 | 1 | 1 | 0 | 14 | 20 | 0 |
| 0 | 1 | 1 | 1 | 1 | 1 | 15 | 21 | 1 |
| 0 | 1 | 1 | 1 | 0 | 1 | 16 | 22 | 0 |
| 0 | 1 | 1 | 1 | 0 | 0 | 17 | 23 | 1 |
| 0 | 1 | 0 | 1 | 0 | 0 | 18 | 24 | 0 |
| 0 | 1 | 0 | 1 | 0 | 1 | 19 | 25 | 1 |
| 0 | 1 | 0 | 1 | 1 | 1 | 1a | 26 | 0 |
| 0 | 1 | 0 | 1 | 1 | 0 | 1b | 27 | 1 |
| 0 | 1 | 0 | 0 | 1 | 0 | 1c | 28 | 0 |
| 0 | 1 | 0 | 0 | 1 | 1 | 1d | 29 | 1 |
| 0 | 1 | 0 | 0 | 0 | 1 | 1e | 30 | 0 |
| 0 | 1 | 0 | 0 | 0 | 0 | 1f | 31 | 1 |
| 1 | 1 | 0 | 0 | 0 | 0 | 20 | 32 | 0 |
| 1 | 1 | 0 | 0 | 0 | 1 | 21 | 33 | 1 |

TABLE 2

| Row | Bit | Qualify (Toggle on next clock when 1) |
|---|---|---|
| 1 | Q27 | ~LSBAUX |
| 2 | Q26 | LSBAUX * ~Q27 |
| 3 | Q25 | LSBAUX * ~Q27 * Q26 |
| 4 | Q24 | LSBAUX * ~Q27 * ~Q26 * Q25 |

TABLE 3

| Row | Bit | Qualify (Toggle on next clock when 1) |
|---|---|---|
| 1 | Q27 | ~LSBAUX |
| 2 | Q26 | LSBAUX * ~Q27 |
| 3 | Q25 | LSBAUX * ~Q27 * Q26 |
| 4 | Q24 | LSBAUX * ~Q27 * ~Q26 * Q25 |
| 5 | Q23 | UPPERAUX * Q24 |
| 6 | Q22 | UPPERAUX * ~Q24 * Q23 |
| 7 | Q21 | UPPERAUX * ~Q24 * ~Q23 * Q22 |
| 8 | Q20 | UPPERAUX * ~Q24 * ~Q23 * ~Q22 * Q21 |
| 9 | Q19 | UPPERAUX * ~Q24 * ~Q23 * ~Q22 * ~Q21 * Q20 |

TABLE 4

Convert from Gray code to Binary

| b0 (msb) = | g0 (msb) |
|---|---|
| b1 = | g1 @ b0 |
| b2 = | g2 @ b1 |
| b3 = | g3 @ b2 |
| b4 = | g4 @ b3 |

What is claimed is:

1. A high speed synchronous digital counter circuit having asynchronous read-out capability, said counter comprising:
   a plurality of lower bit storage means;
   a plurality of upper bit storage means;
   means for causing said lower bit and said upper bit storage means to count using a gray code; and multiple count look-ahead qualification means for transferring a count overflow from said lower bit storage means to said upper bit storage means.

2. The digital counter circuit of claim 1 further comprising serial qualification means for each of said plurality of upper bit storage means.

3. The digital counter circuit of claim 1 wherein said multiple count look-ahead qualification means comprises means for providing an eight count look-ahead.

4. The digital counter of claim 1 further comprising asynchronous latching means for latching an output of said digital counter.

5. The digital counter of claim 1 wherein said plurality of lower bit storage means comprises four bits.

6. Gray code to binary code conversion apparatus for converting parallel gray encoded bits to parallel binary encoded bits, said apparatus comprising:
   means for dividing said gray encoded bits into a plurality of sections of bits wherein said sections are ordered from a high order section having bits with the highest value to a low order section having bits with the lowest value;
   means for converting each of said sections from gray encoding to binary encoding;
   means for exclusive or-ing a low order bit of each of said sections having a higher order than a section being converted; and
   means for inverting each of said bits of said section being converted when the value of said exclusive or-ing means is a logical one.

7. The conversion apparatus of claim 1 wherein said means for exclusive or-ing comprises serial means for exclusive or-ing the low order bit of each section with the exclusive or-ed order bit result from the next higher valued section.

8. The conversion apparatus of claim 6 wherein each of said sections of bits comprises four bits.

9. A process for high speed synchronous digital counting while allowing asynchronous read-out of a count value, said process comprising the steps of:
   providing a counter having lower bit counting registers and upper bit counting registers;
   changing a state of said counter in accordance with a gray code when a clock is received; and
   qualifying said upper bit counting registers a plurality of counts prior to a count overflow from said lower bit counting registers.

10. The process of claim 9 wherein said qualifying step further comprises the step of serially qualifying said registers.

11. The process of claim 9 wherein said qualifying step comprises the step of qualifying said registers eight counts prior to said count overflow.

12. A process for converting bits of a counter encoded using a gray code to bits encoded using a binary code, said process comprising the steps of:
   dividing said bits of said gray encoded counter into a plurality of sections, each having a low order bit and at least one non-low order bit wherein said sections are ordered from a high order section having bits with the highest value to a low order section having bits with the lowest value;
   converting each of said plurality of sections independently from a gray code to a binary code;
   exclusive or-ing said low order bits of all said sections having a higher order than a section being converted; and
   inverting each of said bits of said section being converted when the value of said exclusive or-ing is a logical one.

13. The process of claim 1 wherein said exclusive or-ing step comprises the step of exclusive or-ing said low order bit of each said section with the exclusive or-ed low order bit result from the next higher valued section.

14. The process of claim 12 wherein said dividing step further comprises the step of dividing said counter bits intot sections comprising a low order bit and three non-low order bits.

* * * * *